United States Patent
Xiao et al.

(10) Patent No.: US 7,675,440 B1
(45) Date of Patent: Mar. 9, 2010

(54) THERMOMETER-CODE-TO-BINARY ENCODERS

(75) Inventors: Ping Xiao, East Palo Alto, CA (US);
William W. Bereza, Nepean (CA);
Weiying Ding, Saratoga, CA (US);
Mohsen Moussavi, Kanata (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/111,146

(22) Filed: Apr. 28, 2008

(51) Int. Cl.
*H03M 1/06* (2006.01)
(52) U.S. Cl. .................... 341/118; 341/161
(58) Field of Classification Search ................. 341/155, 341/120, 118, 161, 160
See application file for complete search history.

(56) References Cited

U.S. PATENT DOCUMENTS

| | | | |
|---|---|---|---|
| 4,586,025 A | 4/1986 | Knierim | |
| 5,382,955 A | 1/1995 | Knierim | |
| 5,912,832 A * | 6/1999 | Flahie et al. | ............... 708/707 |
| 6,222,476 B1 | 4/2001 | Lee et al. | |
| 6,298,459 B1 | 10/2001 | Tsukamoto | |
| 6,433,725 B1 * | 8/2002 | Chen et al. | ................... 341/155 |
| 6,778,110 B2 * | 8/2004 | Jansson | ...................... 341/120 |
| 6,798,296 B2 * | 9/2004 | Lin et al. | ..................... 331/1 A |
| 6,816,100 B1 * | 11/2004 | Galton et al. | ............... 341/155 |
| 6,965,331 B2 * | 11/2005 | Demartini et al. | ............. 341/96 |
| 7,227,491 B2 * | 6/2007 | Doerrer et al. | .............. 341/158 |
| 7,286,072 B2 * | 10/2007 | Sakata et al. | ................ 341/155 |
| 7,420,485 B2 * | 9/2008 | Neubauer et al. | ............. 341/77 |
| 7,493,531 B2 * | 2/2009 | Ito et al. | ..................... 714/708 |
| 2007/0262887 A1 | 11/2007 | Matsuura et al. | |

* cited by examiner

*Primary Examiner*—Peguy JeanPierre
(74) *Attorney, Agent, or Firm*—Treyz Law Group; G. Victor Treyz; David C. Kellogg

(57) ABSTRACT

An encoder is provided for converting thermometer code data with bubbles to binary format. An integrated circuit may have circuitry such as digital phase-locked loop circuitry. A thermometer code data word may be used as a control signal for the circuitry. It may be desirable to monitor the thermometer code data word for testing or for downstream processing by control logic on the integrated circuit. The encoder performs thermometer code to binary encoding without requiring that the thermometer code be error corrected to remove bubbles. A bubble detection circuit may be used to detect when the thermometer code data contains bubbles. The encoder may use carry look-ahead adders and pipeline stages.

20 Claims, 15 Drawing Sheets

$$\begin{array}{cccc}
DCW_3 & DCW_2 & DCW_1 & DCW_0 \\
0 & 0 & 0 & 0 \\
1 & 0 & 0 & 0 \\
1 & 1 & 0 & 0 \\
1 & 1 & 1 & 0 \\
1 & 1 & 1 & 1
\end{array}$$

2 BITS OF 5 / 3 BITS OF 5

FIG. 7

| DCW$_3$ | DCW$_2$ | DCW$_1$ | DCW$_0$ | X3 | X2 | X1 | X0 | BOUT |
|---|---|---|---|---|---|---|---|---|
| 0 | 1 | 1 | 1 | 0 | 0 | 0 | 0 | 0 |
| 0 | 0 | 1 | 1 | 0 | 0 | 0 | 0 | 0 |
| 0 | 1 | 0 | 1 | 0 | 1 | 0 | 0 | 1 |

FIG. 12

| DCW$_3$ | DCW$_2$ | DCW$_1$ | DCW$_0$ | X3 | X2 | X1 | X0 | BOUT |
|---|---|---|---|---|---|---|---|---|
| 0 | 0 | 0 | 0 | 0 | 0 | 0 | 1 | 1 |

FIG. 14

THERMOMETER-CODE-TO-BINARY ENCODERS

BACKGROUND

This invention relates to integrated circuits, and more particularly, to circuitry on integrated circuits for encoding thermometer code data as binary data and for using such encoded data.

Digital integrated circuits often contain analog circuitry. For example, some digital integrated circuits contain analog phase-locked loop circuitry. The analog phase-locked loop circuitry may be used as part of a clock and data recovery circuit.

As integrated circuit dimensions shrink with advances in integrated circuit processing technology, it is becoming increasingly difficult to migrate previous generations of analog circuit designs to next generation platforms. This is because analog circuits may be sensitive to changes in transistor speed and other circuit parameters that are directly affected by the alterations that are made to the transistors and other components on an integrated circuit when using an updated fabrication process.

Digital designs may be more immune to undesired changes resulting from process updates. Digital designs may also be more accurate than analog designs in some circumstances. As a result, it is often desirable to implement a circuit such as a phase-locked loop that was previously implemented using an all-analog approach using a digital architecture.

Digital integrated circuits may handle data in a variety of formats. For example, integrated circuits typically handle binary-encoded data. An integrated circuit may also handle data that is in so-called thermometer code. Data in thermometer code may be used in digital circuits in which it is desired to control a number of identical circuit elements. For example, in a digital phase-locked loop, a digital control word may be used to control the frequency that is produced by a digitally controlled oscillator. It may be advantageous to use a scheme in which the digital control word is encoded using thermometer code, because use of control words of this type may enhance the manufacturability of the digitally controlled oscillator. Digitally controlled oscillators that are controlled by binary-encoded control words may be based on binary-weighted tunable capacitors, whereas digitally controlled oscillators that are controlled by thermometer-code control words may include tunable capacitors that are identical in size. Because it may be easier to accurately fabricate a number of identical tunable components than it is to fabricate a number of components of different sizes, digitally controlled oscillators that are based on identical tunable capacitors (and that are controlled by thermometer-code digital control words) may be preferred.

During the operation of a digital integrated circuit that handles thermometer code data, the data may become corrupted due to metastability. For example, in a thermometer code digital control word in a digital phase-locked loop, some of the "1"s in the digital control word may be undesirably replaced by "0"s. When a "1" in a thermometer code control word is replaced by a "0," the thermometer code is said to include a "bubble." In general, a digital control word or other data in thermometer code may have any number of bubbles. In situations with low levels of metastability, the data may be free of bubbles. In situations in which there is a relatively large amount of metastability, multiple bubbles may be present.

During operation of an integrated circuit that is handling data in thermometer code, it may be desirable to convert the thermometer code data into a binary-encoded format. However, it may not be possible to use conventional thermometer-code-to-binary-code encoding architectures when handling thermometer code data that potentially contains bubbles. This is because conventional thermometer-code-to-binary-code encoding schemes that handle bubbles may use error correction circuitry to remove the bubbles prior to encoding, thereby creating potentially significant inaccuracies in the conversion process.

It would therefore be desirable to provide improved ways in which to convert thermometer-code data with bubbles into binary formatted data.

SUMMARY

In accordance with the present invention, integrated circuits may have digital circuitry such as digital phase-locked loop circuitry that generates data in thermometer code. Thermometer code data includes ones and zeros, but does not represent values using the base two system that is used in binary format data.

Encoder circuitry is provided that may be used to convert thermometer code data words to binary format. The binary format data may be stored for subsequent analysis or may be processed by control logic.

The encoder circuitry may contain half adders, two bit adders, and subsequent layers of adders. The adders may be carry look-ahead adders. Thermometer code data may be provided to the inputs of a first layer of the adders. A corresponding binary version of the thermometer code data may be provided at the outputs of a last layer of the adders. Pipeline stages may be interposed among the adders to ensure that the encoder satisfies timing constraints.

A bubble detection circuit may be provided that determines whether the thermometer code data words contain bubbles. If a bubble is detected, the bubble detection circuit may generate an appropriate output signal.

Further features of the invention, its nature and various advantages will be more apparent from the accompanying drawings and the following detailed description of the preferred embodiments.

BRIEF DESCRIPTION OF THE DRAWINGS

FIG. 7 is a diagram showing how many bits of binary data would be required to represent various different sets of possible thermometer code data on a digital integrated circuit in accordance with an embodiment of the present invention.

FIG. 12 is a table showing how the bubble detection circuit of FIG. 11 may detect bubbles in thermometer code data in accordance with an embodiment of the present invention.

FIG. 14 is a table showing how the bubble detection circuit of FIG. 13 may detect a bubble in thermometer code data that does not contain any logic ones in accordance with an embodiment of the present invention.

DETAILED DESCRIPTION

Figure 1:
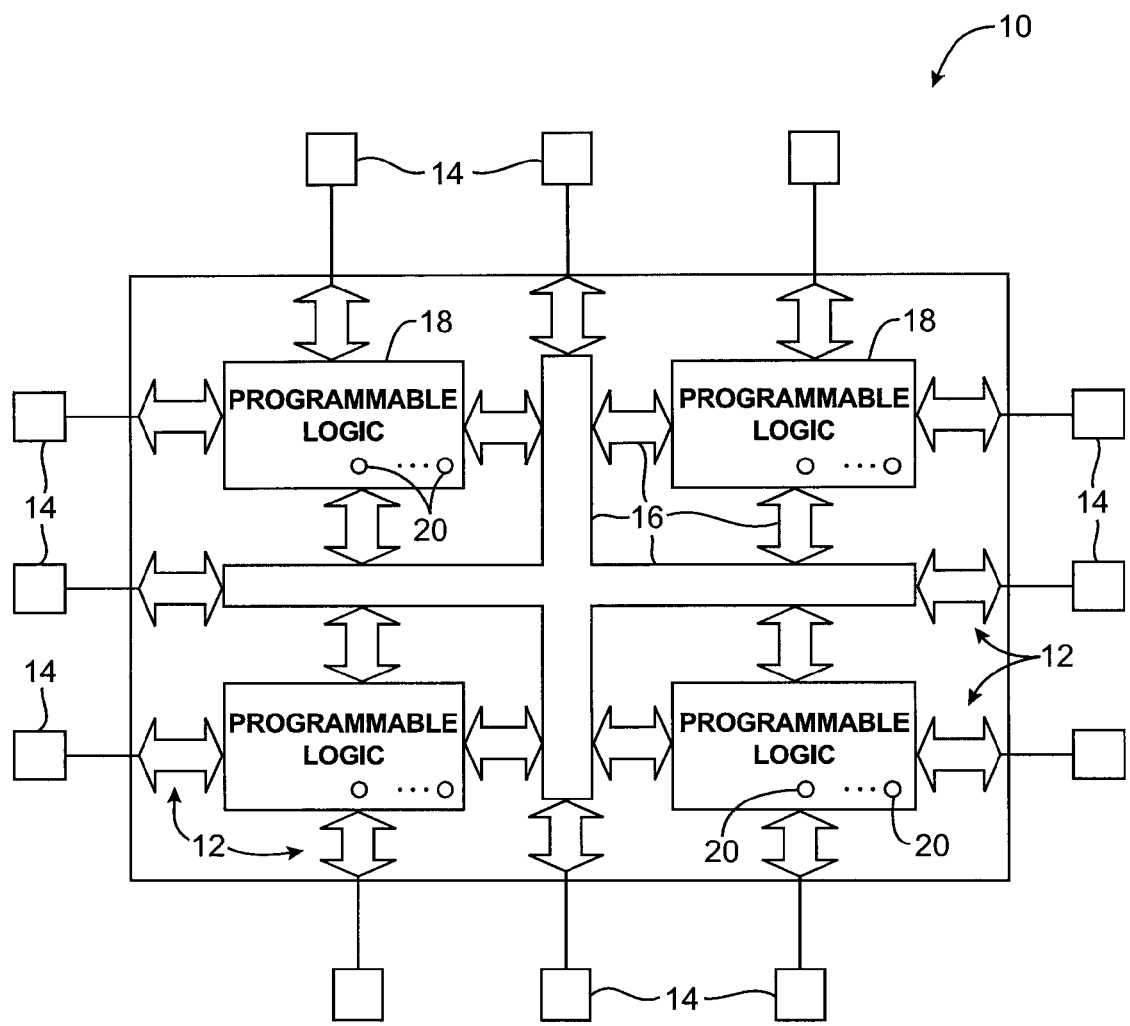
FIG. 1 is a diagram of an illustrative integrated circuit that may contain thermometer-code-to-binary encoder circuitry in accordance with an embodiment of the present invention.

The present invention relates to integrated circuits containing circuitry that handles thermometer code data.

Modern integrated circuits typically handle data using binary words. In binary code, values are represented in base two. For example, the base ten number "9" may be represented by the base two number "1001." Binary format data is typically used in situations in which mathematical computations must be made on the data. For example, binary format data is typically used in circuits in which data is to be multiplied, divided, added, subtracted, etc.

In thermometer code data schemes, a string of bits includes a number of adjacent ones. The number of ones in the string represents the value of the code. For example, consider a four bit thermometer code. Permissible values include "0001," "0011," "0111," and "1111." The presence of each additional logic one in the thermometer code represents an additional unit of value. For example, the thermometer code word "0111" is three times greater in magnitude than the thermometer code word "0001."

Thermometer code is much less efficient than binary code when representing a large range of values. For example, to represent a voltage with an accuracy of one part in 256, would require use of a 256 bit word in thermometer code, but would require use of only an 8 bit word in binary. Because of this inefficiency, thermometer code data schemes are primarily used in specialized circumstances on digital circuits.

For example, thermometer code data may be used in an analog-to-digital converter. In this type of application, it may be easier to manufacture an accurate analog-to-digital converter circuit that uses thermometer code than it would be to manufacture an equally accurate analog-to-digital converter circuit that uses binary data. This is because variations in the semiconductor manufacturing processes that are used during circuit fabrication may make it more difficult to construct circuit components that have binary-weighted values than it would be to construct similar circuit components using a unitary weighting scheme. This type of manufacturability consideration favors the use of thermometer code in particular portions of digital integrated circuits.

On many integrated circuits in which thermometer code data is used in a portion of the circuitry, another portion of the circuitry will require the use of binary format data. Thermometer-code-to-binary encoder circuitry is therefore used to convert the thermometer code data into binary data. Due to non-ideal circuit effects, some integrated circuits may produce thermometer code data with erroneous zero values. These values are typically referred to as bubbles. An example of a thermometer code data word with a bubble is the data word "0000001111111011." The "0" in the third to last place of this data word is an erroneous value and represents a bubble. With conventional arrangements, error correction circuitry may be used to remove bubbles such as this before converting the thermometer code data to binary. However, this conventional approach may not always produce satisfactory results. For example, in data words with large numbers of bubbles, error corrections schemes that fill in the bubbles with ones may produce error-corrected data words whose corrected values differ significantly from their proper values.

In accordance with an embodiment of the present invention, improved circuitry and methods for handling thermometer code data on integrated circuits is provided. Using thermometer-code-to-binary encoder circuitry, it is possible to convert thermometer code data that contains bubbles to binary without introducing the types of errors that would be produced with conventional thermometer code error-correction techniques.

The binary encoder circuitry and methods may be used in the context of any suitable integrated circuits such as memory chips, digital signal processing circuits, microprocessors, application specific integrated circuits, programmable logic device integrated circuits, analog-to-digital converter circuits, or any other suitable integrated circuit. The use of the binary encoder circuitry of the present invention may sometimes be described in the context of integrated circuits such as programmable integrated circuits. This is, however, merely illustrative. The binary encoder circuitry and methods of the present invention may be used in the context of any suitable integrated circuit. Programmable logic device integrated circuits using binary encoder techniques in accordance with embodiments of the present invention are described herein only as an example.

An illustrative integrated circuit in accordance with an embodiment of the present invention is shown in FIG. 1. Integrated circuit 10 may be any suitable integrated circuit, such as a programmable logic device integrated circuit (as an example).

As shown in FIG. 1, programmable logic device integrated circuit 10 may have input/output circuitry 12 for driving signals off of device 10 and for receiving signals from other integrated circuits via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 that can be loaded with data such as configuration data (also called programming data) using pins 14 and input/output circuitry 12. Once loaded, the memory elements may each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) transistors such as power-down transistors.

When a memory element supplies a high output to a NMOS pass transistor, the transistor is turned on and passes logic signals from its input to its output. When the memory element output is low, the pass transistor is turned off and does not pass logic signals. Being able to configure pass transistors in this way allows the programmable logic of the programmable logic device to be programmed to implement a desired logic design.

When a memory element supplies a low output to a PMOS power-down transistor, the transistor is turned on. This allows a block of associated logic circuitry to receive power. When the memory element supplies a high output to the PMOS power-down transistor, the transistor is turned off. This powers down the block of circuitry.

A typical memory element 20 is formed from a number of transistors configured to form cross-coupled inverters. With one suitable approach, complementary metal-oxide-semiconductor (CMOS) integrated circuit technology is used to form the memory elements 20. In the context of programmable logic device integrated circuits, the memory elements store configuration data and are therefore sometimes referred to as configuration random-access memory (CRAM) cells. The memory elements may be loaded from an external source such as a configuration device integrated circuit via pins 14 and input/output circuitry 12. The loaded memory elements 20 provide static control signals that are applied to the terminals of circuit elements in programmable logic 18 to turn certain circuit elements on or off and thereby configure the logic in programmable logic 18.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
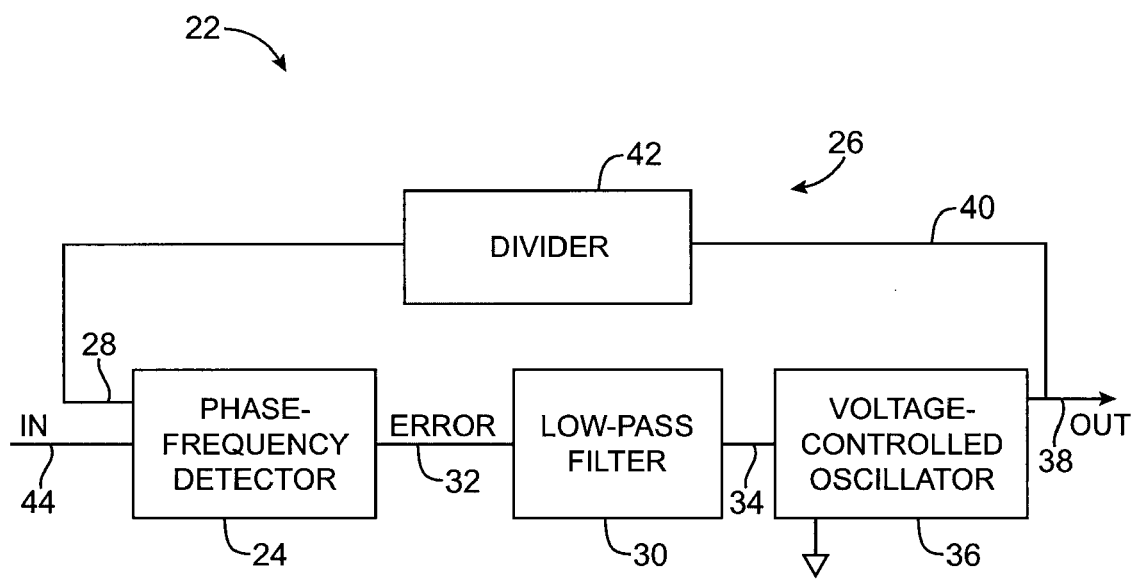
FIG. 2 is a diagram of a conventional analog phase-locked loop of the type that may be used on an integrated circuit.

Integrated circuits such as programmable logic device integrated circuits often use analog phase-locked-loop circuitry. For example, analog phase-locked loops are often used in clock and data recovery circuitry. A typical conventional analog phase-locked loop is shown in FIG. 2. As shown in FIG. 2, phase-locked-loop circuit 22 has a phase-frequency detector 24 that receives a reference clock signal or other input signal at input 44. The phase-frequency detector 24 also receives a feedback signal from feedback path 26 at input 28. Phase-frequency detector 24 compares the signals on lines 44 and 28 and generates a corresponding error control signal ERROR on path 32 for charge pump and low pass filter 30. The error signal directs circuitry 30 to generate a higher or lower voltage on its output line 34, as needed to lock the frequency of circuit 22 to its input.

Voltage-controlled oscillator 36 may contain a ring of buffers. The buffers may be powered using a positive power supply rail that is connected to the output of the charge pump or other suitable circuitry in low-pass filter 30 and a ground power supply rail. The frequency of the output of voltage controlled oscillator 36 may be controlled by adjusting the voltage level on line 34.

Voltage-controlled oscillator 36 may produce an output signal OUT at its output 38. Path 40 may be used to feed back the signal OUT from the voltage-controlled oscillator to divider 42. Divider 42 may divide the signal OUT by an appropriate integer (e.g., by one, by two, by more than two, etc.).

The amount by which divider 42 divides signal OUT determines the ratio between frequency of IN and the frequency of OUT. In a typical system, input path 44 may receive a reference clock signal IN at a first frequency and output path 38 may provide a locked output clock signal OUT at a higher frequency as determined by the integer value associated with divider 42.

Although analog phase-locked loop circuits such as the conventional analog phase-locked loop circuit 22 of FIG. 2 may operate satisfactorily, there is interest in developing digital phase-locked loop circuits for next generation integrated circuits. Digital phase-locked loop architectures may offer performance advantages over analog designs and may be easier to migrate between successive generations of process technology.

Figure 3:
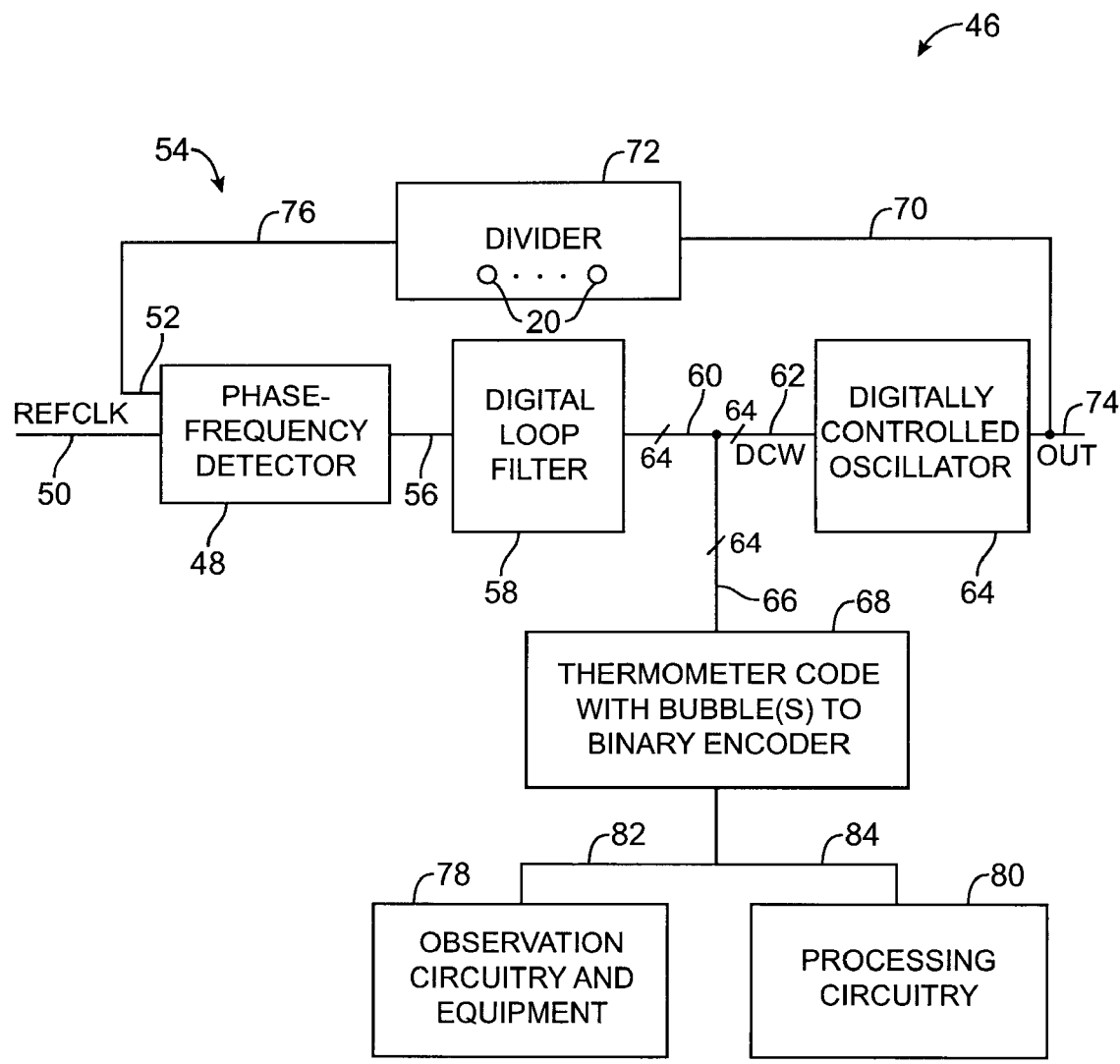
FIG. 3 is a diagram of an illustrative digital circuit such as a digital phase-locked loop that uses thermometer-code data in accordance with an embodiment of the present invention.

An illustrative digital phase-locked loop circuit in accordance with an embodiment of the present invention is shown in FIG. 3. As shown in FIG. 3, phase-locked-loop circuit 46 may have a phase-frequency detector 48. As with analog phase-locked loop circuitry 22 of FIG. 2, phase-frequency detector 48 of digital phase-locked loop circuit 46 may receive a reference clock signal REFCLK or other input signal at input 50. Phase-frequency detector 48 also receives a feedback signal from feedback path 54 at input 52. Phase-frequency detector 48 compares the signals on lines 50 and 52 and generates a corresponding error control signal on path 56 for digital loop filter 58. The error signal directs filter circuitry 58 to generate a digital control word DCW on output path 60. The signal DCW may be provided in thermometer code. There may be any suitable number of conductive lines in path 60. For example, there may be 64 lines in path 60 (as an example).

The digital control signal DCW may be provided to the input of digitally controlled oscillator 64 via path 62 and may be provided to the input of thermometer-code-to-binary encoder 68 via path 66. Paths 62 and 66 may have the same number of lines as path 60 (e.g., sixty four or any other suitable number).

In digital phase-locked loop circuit 46 of FIG. 3, the digital circuitry of digitally controlled oscillator 64 and digital loop filter 58 are used to digitally perform the functions of analog circuits 30 and 36 in the conventional analog phase-locked loop 22 of FIG. 2.

The output signal OUT of digital phase-locked loop circuit 46 may be used as a clock signal or other signal on a circuit such as programmable logic device integrated circuit 10 of FIG. 1. The frequency of the output of digitally controlled oscillator 64 is determined by the value of the thermometer code digital control word DCW that is received via input path 62.

Path 70 may be used to feed back the signal OUT from digitally controlled oscillator 64 to divider 72. Divider 72 may divide the signal OUT by an appropriate integer N (e.g., by one, by two, by more than two, etc.). If desired, the value of N may be adjusted using programmable logic 18 (e.g., by configuration data loaded into one or more memory elements 20 associated with divider 72). The divided output of divider 72 may be provided to input 52 over line 76 in feedback path 54.

The amount by which divider 72 divides signal OUT determines the ratio between the frequency of REFCLK (or other input signal at input 50) and the frequency of output signal OUT on output path 74. For example, input IN may receive a reference clock signal at a given frequency and input OUT may provide a locked output clock signal at a frequency of N times the given frequency. In a typical scenario, the frequency of REFCLK might be 100 MHz and the frequency of OUT might be 400 MHz (as an example).

The circuitry of digitally controlled oscillator 64 may be implemented using any suitable tunable circuit components. With one suitable arrangement, digitally controlled oscillator 64 may include a number of tunable capacitors. The capacitance of each capacitor in digitally controlled oscillator 64 may contribute to the frequency of the signal at output OUT. By tuning this total capacitance value, the frequency of OUT may be adjusted.

The tunable capacitors in digitally controlled oscillator 64 can be challenging to fabricate with high accuracy. Particularly in binary-weighted schemes, it may be difficult to precisely fabricate the tunable capacitors so that the larger tunable capacitors have precisely the capacitances desired in relation to the smaller tunable capacitors. This is because it is often challenging to fabricate a variety of integrated circuit structures of different sizes and shapes with precisely controlled ratios.

As a result, it may be advantageous to fabricate the tunable capacitors or other structures in digitally controlled oscillator 64 using a unitary weighting scheme. With a unitary weighting scheme, each of the tunable capacitors has the same basic size and structure. It is generally easier to ensure that the relative sizes and shapes of the capacitors are controlled accurately (i.e., that the sizes and shapes of the tunable capacitors are all equal) using this type of scheme. Because of these manufacturing considerations, it is generally easier to obtain high accuracy using a unitary component weighting scheme than with a binary or other non-unitary component weighting scheme.

A digital control word signal DCW that is in thermometer code may be used to control the values of unitary-weighted tunable capacitors or other tunable components in digitally controlled oscillator 64. Each bit of the thermometer code signal DCW may be conveyed on a respective line of path 62 and may be applied to the control input of a respective unitary-weighted tunable capacitor or other tunable component in digitally controlled oscillator 64. When, for example, a given bit of DCW is high (i.e., has a logic one value), the tunable capacitor or other component that is controlled by that bit may have a first capacitance (or other tunable parameter). When that given bit of the DCW is low (i.e., has a logic zero value), the tunable capacitor or other component may have a second capacitance (or other tunable parameter). In operation, all of the bits of signal DCW control respective components to tune the frequency of output signal OUT on path 74.

During operation of digital phase-locked loop circuit 46 or other digital circuitry on an integrated circuit that includes thermometer code data, it may be advantageous to monitor or otherwise use the thermometer code data elsewhere on the integrated circuit. For example, it may be desirable to monitor the value of signal DCW for testing using on-chip data observation circuitry and on-chip or off-chip data processing equipment 78 (e.g., off-chip testing equipment). It may also be desirable to use the thermometer code data as an input to circuitry other than circuit 46 on integrated circuit 10 such as processing circuitry 80.

Because there are a relatively large number of data lines associated with thermometer code data paths such as paths 60, 62, and 66, it may be advantageous to convert the thermometer code data to a more compact format such as binary before distributing the data over paths such as path 82 and/or path 84. Circuitry such as thermometer-code-to-binary encoder 68 of FIG. 3 may be used to perform this type of encoding operation. Once the thermometer code data has been converted to binary, the binary version of the data can be readily manipulated (e.g., during real-time monitoring for testing and evaluation, for downstream processing by on-chip circuitry, etc.).

Circuit metastabilities may cause one or more of the logic ones in a thermometer code data word such as signal DCW to erroneously flip state and become logic zeros. These erroneous thermometer code bits are often referred to as bubbles. In general, signal DCW may have no bubbles (i.e., signal DCW may be a pure thermometer code word), may have one bubble, or may have multiple bubbles. The pattern of bubbles in signal DCW is generally not predictable.

Figure 4:
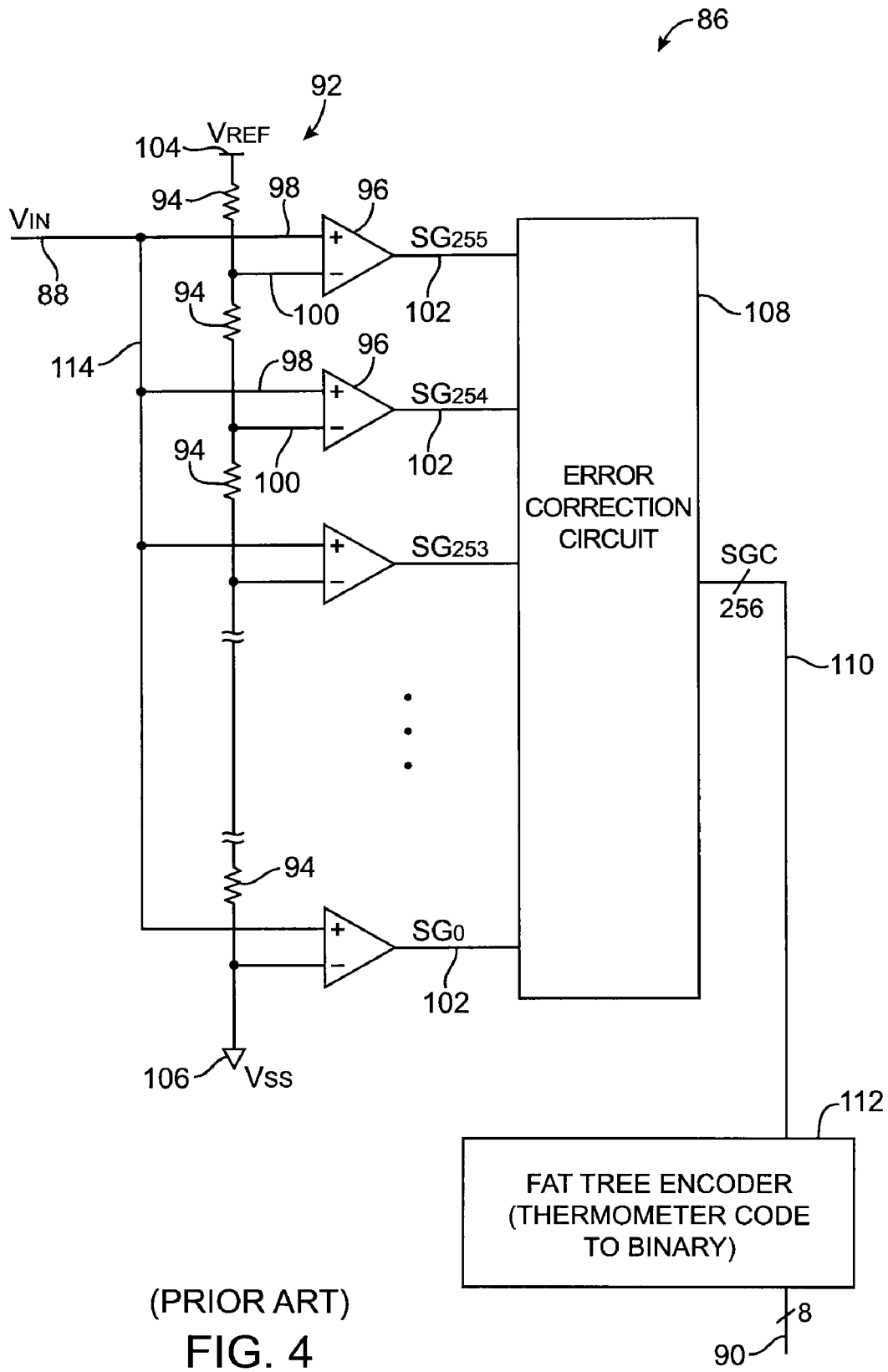
FIG. 4 is a diagram of a conventional analog-to-digital converter circuit that includes error correction circuitry for removing bubbles from thermometer code data prior to encoding the thermometer-code data as binary data.

In conventional integrated circuits, the conversion of thermometer code data with bubbles to binary data involves the use of error correction circuitry based on a predictable bubble pattern. As an example, consider the conventional analog-to-digital converter integrated circuit of FIG. 4. As shown in FIG. 4, analog-to-digital converter circuit 86 may receive an analog voltage Vin at input 88 and may produce a corresponding digital version of the input signal at output 90. In the example of FIG. 4, analog-to-digital converter 86 is an eight bit converter, so the binary output signal on output path 90 contains eight bits and path 90 contains eight parallel lines each of which carries a respective one of these eight bits.

Analog-to-digital converter 86 has a voltage divider 92 formed from resistors 94. Resistors 94 may be connected in series between positive reference voltage Vref at terminal 104 and ground voltage Vss at terminal 106. In an eight bit analog-to-digital converter, there may be, for example, 256 resistors 94 in voltage divider 92. Branch conductors 100 may be used to tap voltage divider 92 at respective nodes. Comparators 96 may each have two inputs. A first of the two inputs may receive a respective reference voltage from one of the nodes in voltage divider 92. Each resistor 94 may have the same resistance. With this type of arrangement, the reference voltages provided to the reference voltage inputs of comparators 96 may each differ by an equal amount. Voltage Vin is routed to the inputs of comparators 96 via path 114 and branch conductors 98. Each comparator may receive the same input voltage Vin.

Each comparator 96 may compare the voltage Vin on its input 98 to the reference voltage on its input 100 and may produce a corresponding high or low output signal SGi on its output 102. If the input Vin for a given comparator is lower than the voltage on its reference voltage input 100, the output of that comparator will be low. If the input Vin for a given comparator is higher than the voltage on its reference voltage input 100, the output of that comparator will be high. The collective output data word {SGi} may be provided to error correction circuit 108 over paths 102. The data word {SGi} is a multibit thermometer code data word that digitally represents the analog voltage Vin.

During operation of analog-to-digital converter circuit 86, comparator offset may cause a comparator 96 that should have produced a logic one at its output to erroneously produce a logic zero, or vice versa, when the voltage Vin is very close to the reference voltage of this stage. In this situation, the thermometer code version of voltage Vin (i.e., thermometer code version SG of voltage Vin) will contain a bubble. This bubble is relatively predictable because it usually appears around the "1" and "0" boundary of the code.

In analog-to-digital converter circuit 86, thermometer code data may be converted to binary using fat tree encoder 112. However, if a thermometer code signal with a bubble is provided to the input of a conventional thermometer-code-to-binary encoder such as fat tree encoder 112, an erroneous output signal will be produced at output 90. Accordingly, conventional analog-to-digital converter circuit 86 includes error correction circuit 108. Error correction circuit 108 can use different algorithms based on the expected bubble patterns and converter accuracy requirements. Here, as an example, the "fill the bubbles" algorithm is used to process the thermometer code data word SG. With this type of algorithm, the bubble(s) in data word SG are converted to logic ones. The resulting error-corrected version SGC of data word SG is provided at the output of error correction circuit 108 and is routed to the input of fat tree encoder 112 via path 110. Because error-corrected signal SGC does not contain bubbles, fat tree encoder 112 can convert the 256 bits of thermometer code signal SGC to eight corresponding bits of binary at output 90.

Conventional circuit arrangements such as the conventional circuit of FIG. 4 generally do not work satisfactorily in digital circuits such as digital phase-locked loop circuit 46 of FIG. 3. This is because the metastabilities that may be encountered in a circuit such as circuit 46 of FIG. 3 are unpredictable and may result in potentially large strings of bubbles in digital control word DCW. If a simple "fill the bubbles" error correction circuit were to be used in the control loop of a circuit of the type shown in FIG. 3 (e.g., in path 60), the loop might not function properly. This is because the error-corrected version of the digital control signal could have a significantly different thermometer code value than the uncorrected version. Moreover, inserting this type of error correction circuit in path 64 would results in monitored thermometer code signal values that differ from the actual values of DCW in the digital phase-locked loop 46 and/or erroneous processed DCW values in processing circuitry 80.

Figure 5:
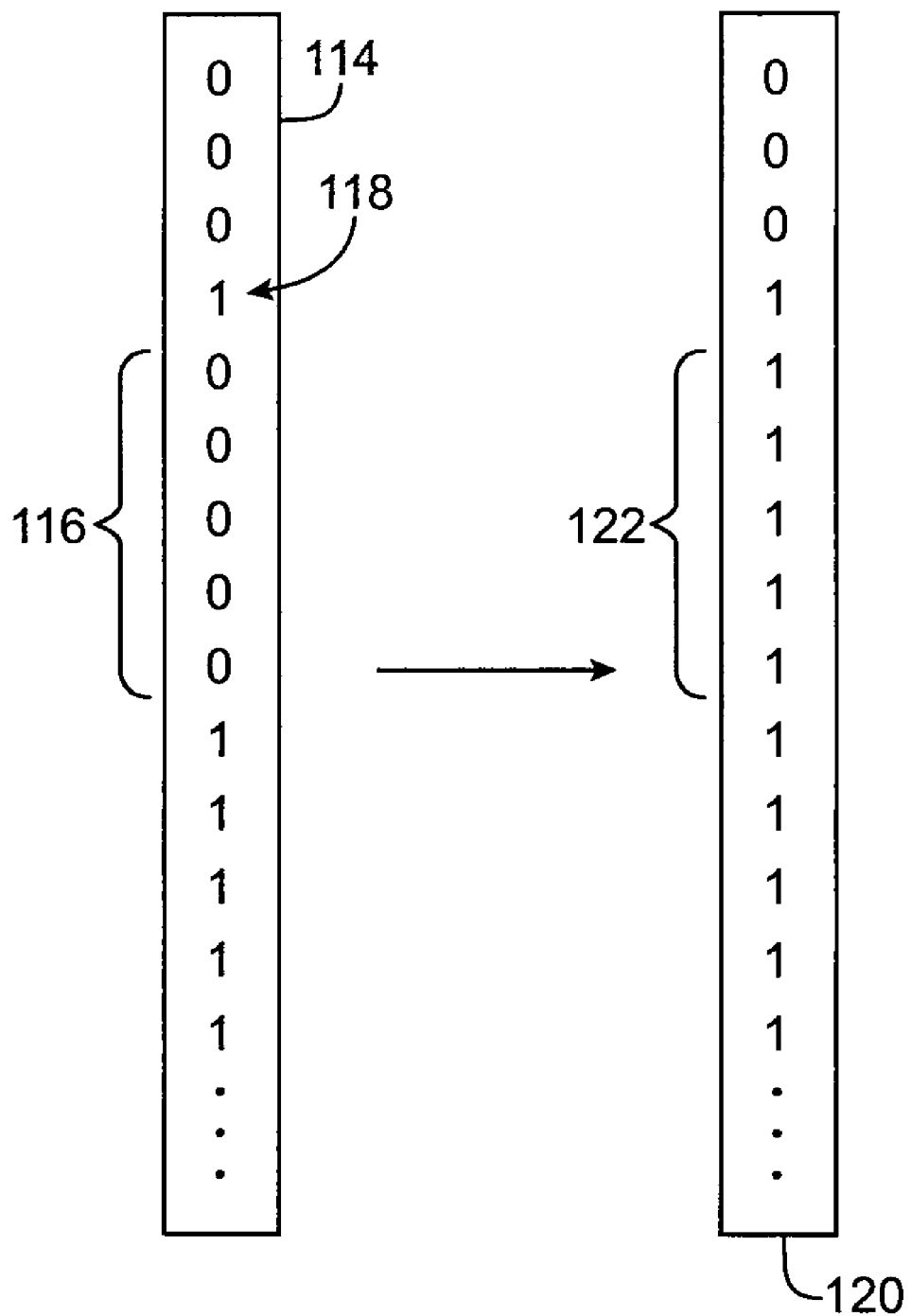
FIG. 5 shows how thermometer code data that includes bubbles would appear before and after error correction of the type available from the error correction circuitry of FIG. 4 is performed.

FIG. 5 shows an illustrative thermometer code data word with bubbles (word 114). This type of thermometer code data might be produced, as an example, when a zero in a digital control word in a digital phase-locked loop circuit is erroneously changed into a one due to circuit metastability. As shown in FIG. 5, thermometer code data word 114 has a string of five bubbles 116 that have arisen because of the presence of erroneous logic one bit 118. If using a simple "fill in the bubbles" error correction algorithm, thermometer code data word 114 may be changed to error-corrected data word 120. In error-corrected word 120, bubbles 116 have been filled with ones 122. This ensures that error-corrected word 120 is free of bubbles, but can significantly change the value of the thermometer code data, which is represented by the number of ones that are present. For example, thermometer code word 114 with bubbles 116 may have a value of 20, whereas error-corrected code word 120 may have a value of 25. This type of large change in the value of the thermometer code data may be unacceptable. For example, in a scenario of the type described in connection with digital phase-locked loop circuit 46 of FIG. 3, a large change in the value of digital control word DCW may cause circuit 46 to not function properly.

Figure 6:
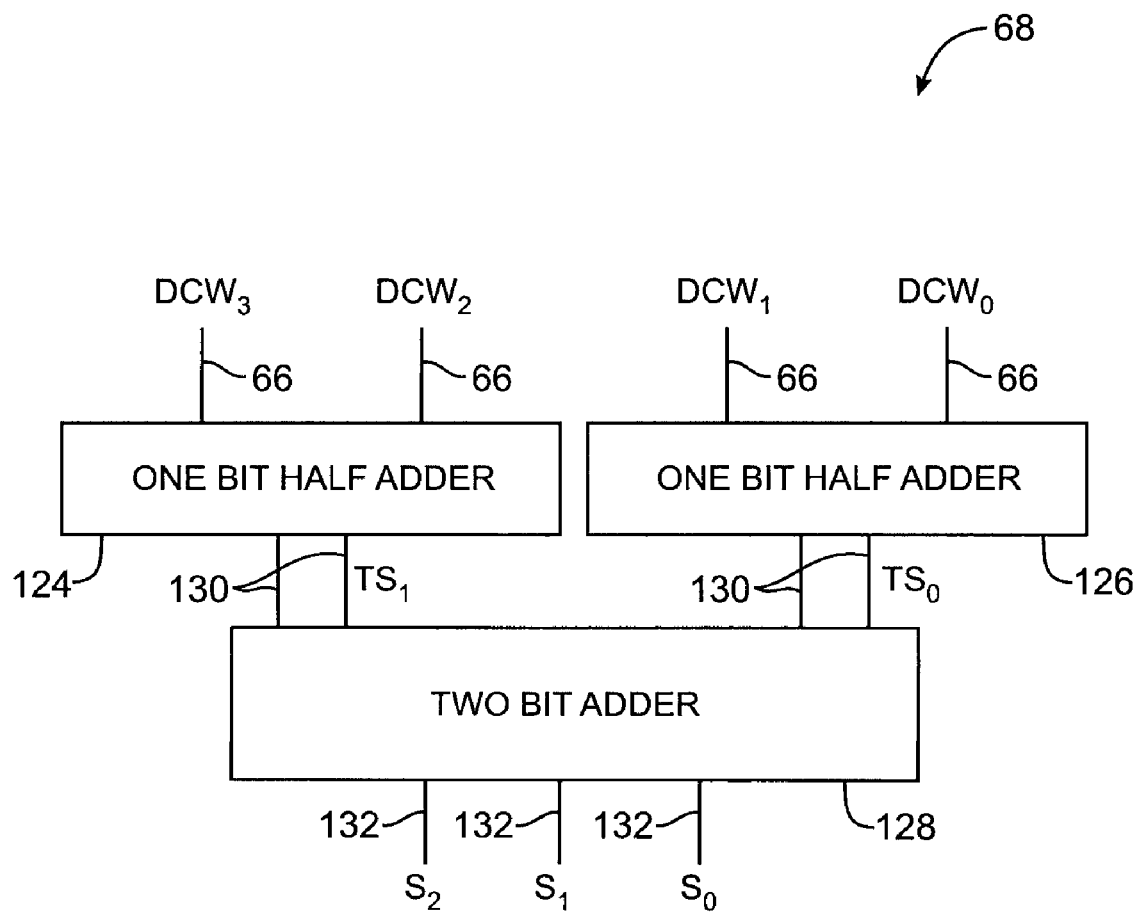
FIG. 6 is a circuit diagram of an illustrative thermometer-code-to-binary encoder in accordance with an embodiment of the present invention.

In accordance with an embodiment of the present invention, thermometer code data words with bubbles may be converted to binary while avoiding unacceptable error correction algorithms. Thermometer-code-to-binary encoder circuitry 68 in accordance with an embodiment of the present invention is shown in FIG. 6. As shown in FIG. 6, thermometer code data may be presented to inputs 66 of encoder 68. A corresponding binary encoded version of data word DCW (called S) is produced at output lines 132. In the example of FIG. 6, there are four inputs 66, each of which receives a respective bit DCWi of thermometer code data word DCW, and there are three outputs, each of which receives a respective binary output bit Si. This is merely illustrative. In general, there may be any suitable number of bits in the input and output data. For example, the input thermometer code data may have tens or hundreds of bits and the output binary data may have a corresponding number of bits (i.e., a number of binary bits sufficient to represent the number of thermometer code data bits in binary).

As shown in FIG. 6, encoder 68 may have one bit half adders such as one bit half adder 124 and one bit half adder 126. Each one bit half adder may receive two respective thermometer code bits on its inputs and may produce a corresponding temporary sum TSi on its two outputs 130. In the example of FIG. 6, one bit half adder 124 receives thermometer code bits DCW3 and DCW2 on two inputs 66 and produces a two-bit temporary sum TS1 on two respective output lines 130, whereas one bit half adder 126 receives thermometer code bits DCW1 and DCW0 on two inputs 66 and produces a two-bit temporary sum TS0 on two respective output lines 130.

Temporary sums TS1 and TS0 may be added using two bit adder 128. Two bit adder 128 may have four input lines, two of which receive temporary sum TS1 and two of which receive temporary sum TS0. Two bit adder 128 may add sums TS1 and TS0 to produce a corresponding output signal S on output lines 132. In the example of FIG. 6, three output lines 132 are used for handling three respective binary signals S2, S1, and S0. The output signal S on output lines 132 represents a count of the number of ones that are present in thermometer code word DCW. For example, if thermometer code word DCW is 0111, signal S on outputs 132 will be a binary representation of the number 3 (i.e., S=011; S2=0, S1=1, and S0=1).

The desirability of using three binary output lines to handle the binary encoded version of a four-bit input thermometer code word DCW is illustrated in FIG. 7. As shown in FIG. 7, input word DCW may have pure thermometer code values 1000, 1100, 1110, or 1111. These versions of input word DCW (or equivalent versions with the same number of logic ones) may be represented by two bits of binary output data. There is, however, another possible input value for thermometer code data DCW. In particular, the presence of a bubble may create a situation in which DCW=0000, as indicated in FIG. 7. To handle this fifth possibility, at least three bits of binary output data are required (i.e., because $2^3$ is greater than or equal to $2^2+1$).

Figure 8:
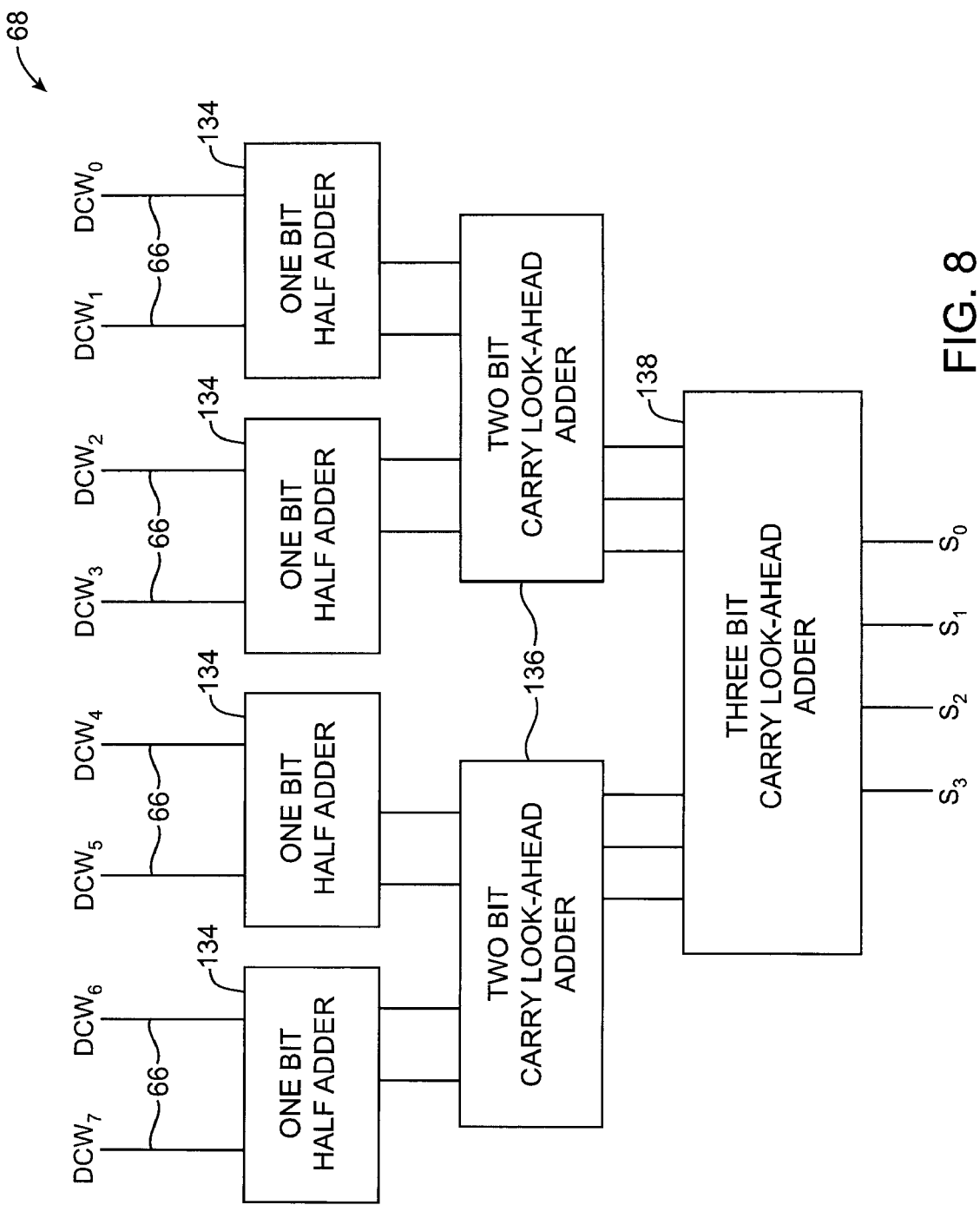
FIG. 8 is circuit diagram of an illustrative thermometer-code-to-binary encoder including carry look-ahead adder circuitry in accordance with an embodiment of the present invention.

If desired, the speed with which encoder 68 produces valid binary output data corresponding to the thermometer code input data may be enhanced. With one suitable arrangement, which is shown in FIG. 8, the speed with which the thermometer code input data is converted to binary may be enhanced by using carry look-ahead adders in encoder 68. In particular, encoder 68 of FIG. 8 uses two bit carry look-ahead adders 136 and three bit carry look-ahead adder 138. As the FIG. 8 example demonstrates, encoders 68 that handle more bits of thermometer code data DCW at their inputs 66 may produce corresponding larger number of bits of binary data S at their outputs. The FIG. 8 example also shows how encoders that handle larger input words (e.g., an eight bit word DCW) may use more layers of adder circuitry to produce the binary encoded output signal. Each one bit half adder 134 adds two inputs to produce a corresponding two bit output. Pairs of these two bit output signals are added by respective two bit carry look-ahead adders 136. Each two bit carry look-ahead adder 136 may add two respective two bit inputs to produce a corresponding three bit output signal. The three bit output signals from the pair of two bit carry look-ahead adders 136 may be added by three bit carry look-ahead adder 138. The four bit output S of three bit carry look-ahead adder 138 represents the binary version of thermometer code word DCW. Using this encoder architecture, a valid binary output is produced that represents the number of ones in thermometer code input data DCW, even if data DCW contains one or more bubbles.

Figure 9:
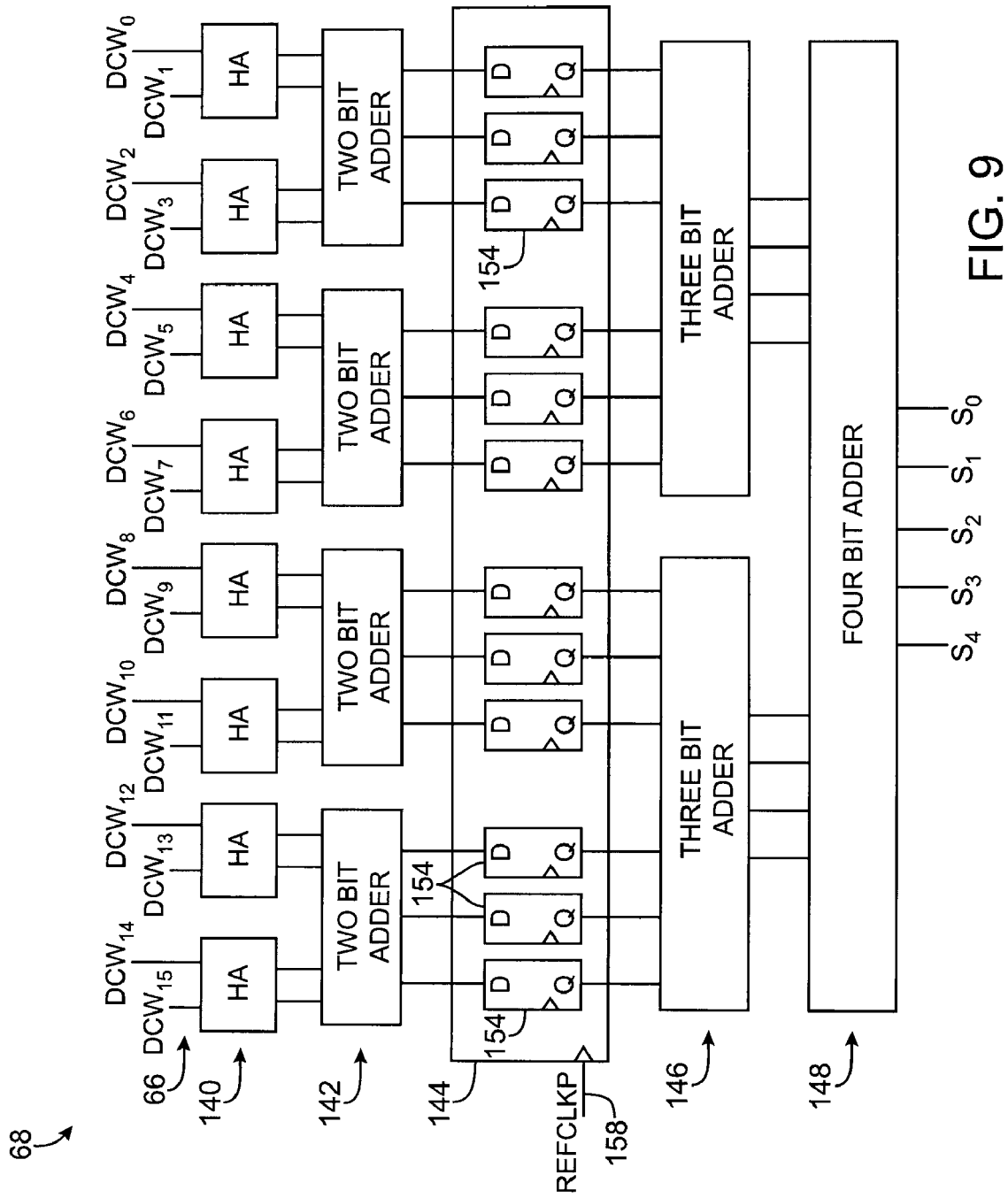
FIG. 9 is a circuit diagram of an illustrative thermometer-code-to-binary encoder including pipeline circuitry in accordance with an embodiment of the present invention.

Another illustrative configuration for encoder 68 is shown in FIG. 9. In the example of FIG. 9, encoder 68 has pipeline stage 144. Pipeline stage 144 has registers 154. Registers 154 may be, for example, D-type flip flops or other suitable latch circuitry. Registers 154 may receive a clock signal such as clock REFCLKP from clock line 158. Clock REFCLKP may be synchronized with thermometer code word DCW.

In the FIG. 9 example, there are 16 bits of thermometer code input data (DCW15 . . . DCW0) that are applied to input 66 of encoder 68. Half adders 140 (e.g., one bit half adders) are used to sum respective pairs of the input bits. The two-bit output of each half adder 140 is applied to one of the two-bit inputs of two bit adders 142.

The outputs of the two bit adders 142 are connected to the D inputs of respective registers 154 in pipeline stage 144. The Q outputs of registers 154 route registered signals from pipeline stage 144 to the inputs of three bit adders 146. Three bit adders 146 each add a pair of three bit input signals and produce a corresponding four bit output. Four bit adder 148 adds the four bit outputs from three bit adders 146 and produces binary encoded output signal S (i.e., S4, S3, S2, S1, and S0).

The use of pipeline stage 144 helps to ensure that encoder 68 functions properly. Without pipeline stage 144, the total delay of each of the adder stages in encoder 68 must be less than the cycle time of the thermometer code clock (e.g., REFCLKP). When pipeline stage 144 is used, however, these timing constraints are relaxed. If the delays associated with half adders 140 and two bit adders 142 are cumulatively less than the cycle time and if the delays associated with three bit adders 146 and four bit adder 148 are cumulatively less than the cycle time, the necessary timing constraints will be satisfied and encoder 68 will function properly.

In the example of FIG. 9 there is a single pipeline stage 144. In general, a thermometer-code-to-binary encoder in accordance with an embodiment of the invention may have any suitable number of pipelines stages (e.g., two stages, three stages, more than three stages, etc.). The use of an architecture with a single pipeline stage is shown in FIG. 9 as an example.

Figure 10:
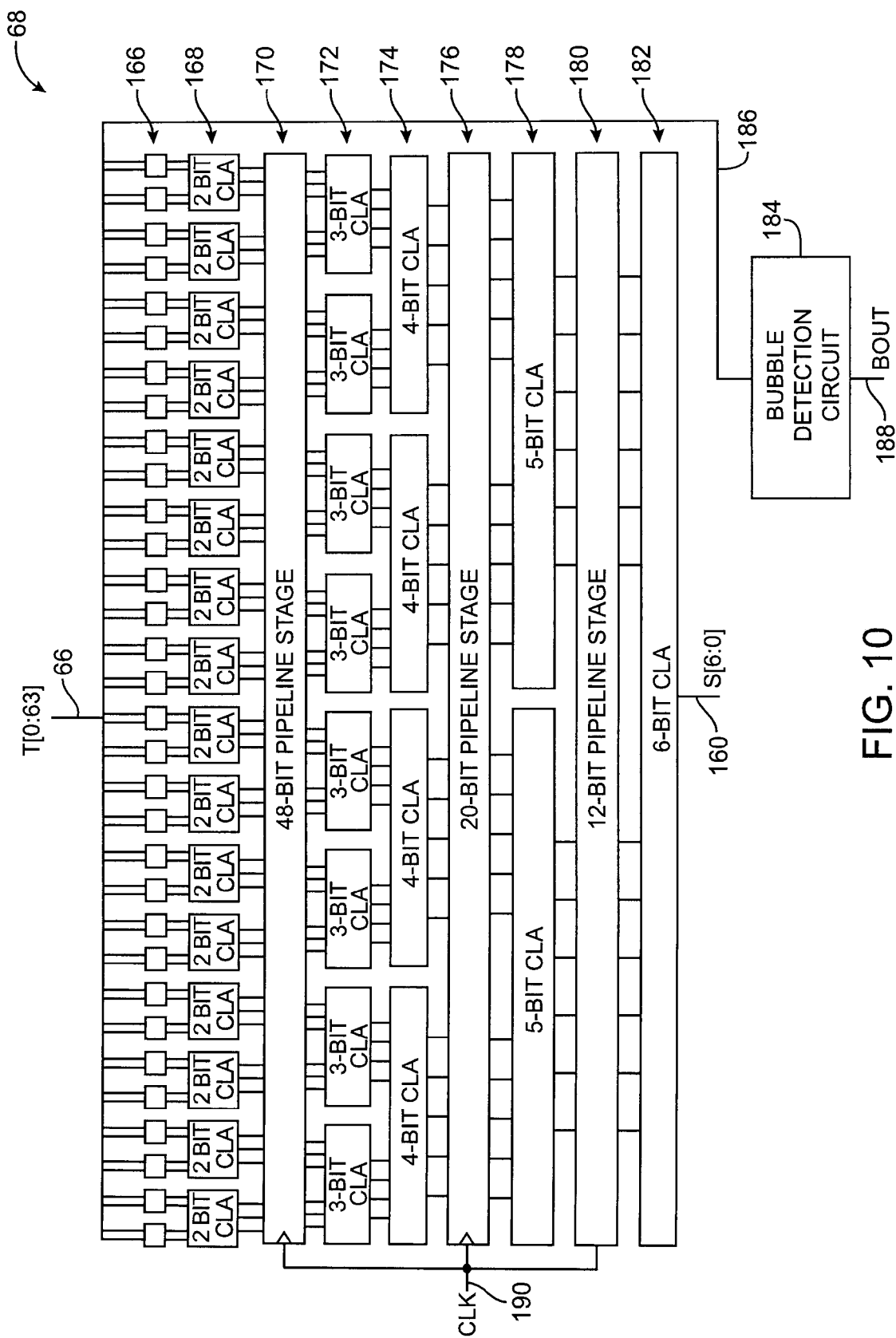
FIG. 10 is a circuit diagram of an illustrative thermometer-code-to-binary encoder including carry look-ahead adders, pipeline stages, and bubble detection circuitry in accordance with an embodiment of the present invention.

An illustrative thermometer-code-to-binary encoder 68 having more than one pipeline stages is shown in FIG. 10. In the example of FIG. 10, encoder 68 receives 64 bits of thermometer code data T[0:63] at input 66 and produces 7 bits of corresponding binary data S[6:0] at output 160. Half adders 166 each receive two bits of input data and produce a corresponding two-bit sum. Two bit carry look-ahead adders 168 each receive a pair of two bit inputs from respective half adders 168 and produce a corresponding three bit output.

After passing through pipeline stage 170, the outputs from two bit carry look-ahead adders 168 are added by three bit carry look ahead adders 172. Each three bit carry look-ahead adder 172 receives a pair of three bit input signals and produces a corresponding four bit sum at its output. Four bit carry look-ahead adders 174 add the outputs from three bit carry look-ahead adders 172.

After passing through pipeline stage 176, the outputs from four bit carry look-ahead adders 174 are added by five bit carry look ahead adders 178. Each five bit carry look-ahead adder 178 receives a pair of five bit input signals and produces a corresponding six bit sum at its output. Six bit carry look-ahead adder 182 receives two six bit input signals and produces a corresponding seven bit output signal S[6:0] at output 160. Signal S at output 160 represents a binary version of the thermometer code data signal T[0:63] that was provided to input lines 66).

The pipelines stages in encoder 68 help to ensure that encoder 68 will operate properly and will not violate timing constraints. Pipeline stages 170, 176, and 180 may be clocked by a clock signal (e.g., CLK) that is synchronized with the thermometer code data at input 66. Each pipeline stage may have a number of corresponding registers (e.g., D-type flip flops as described in connection with FIG. 9). For example, pipeline stage 170 may have 48 registers each of which receives one of the output bits from the two bit carry look-ahead adders 168, pipeline stage 176 may have twenty registers each of which receives a bit of data from a respective one of the output lines associated with four bit carry look-ahead adders 174, and pipeline stage 180 may have twelve registers each of which receives a bit of data from a respective one of the output lines associated with five bit carry look-ahead adders 178.

The registers of the pipelines stages may have clock inputs that receive the clock signal CLK from line 190. Because there are three pipelines stages in encoder 68 of FIG. 10, encoder 68 of FIG. 10 has a three cycle latency (i.e., it is necessary to wait for three clock cycles for signal S[6:0] to become valid at the output after a thermometer code data word T[0:63] is presented to input 66).

It may be desirable to produce an indication of the presence of bubbles in thermometer code data T. In the arrangement of FIG. 10, encoder 68 has a bubble detection circuit 184. Thermometer code data T may be provided to the input of bubble detection circuit 184 via path 186 (e.g., a 64-line path when T[0:63] has 64 bits). Bubble detection circuit 184 may produce an output signal BOUT that is indicative is whether one or more bubbles are present within data T. If, for example, no bubbles are present, output signal BOUT may be low (zero). If one or more bubbles are detected within the thermometer code data, output BOUT may be taken high (one). The signal BOUT may be used in conjunction with monitored values of S at output 160 when monitoring thermometer code data T at input 66 (e.g., during testing). The signal BOUT may also be processed by downstream processing circuitry on an integrated circuit.

Figure 11:
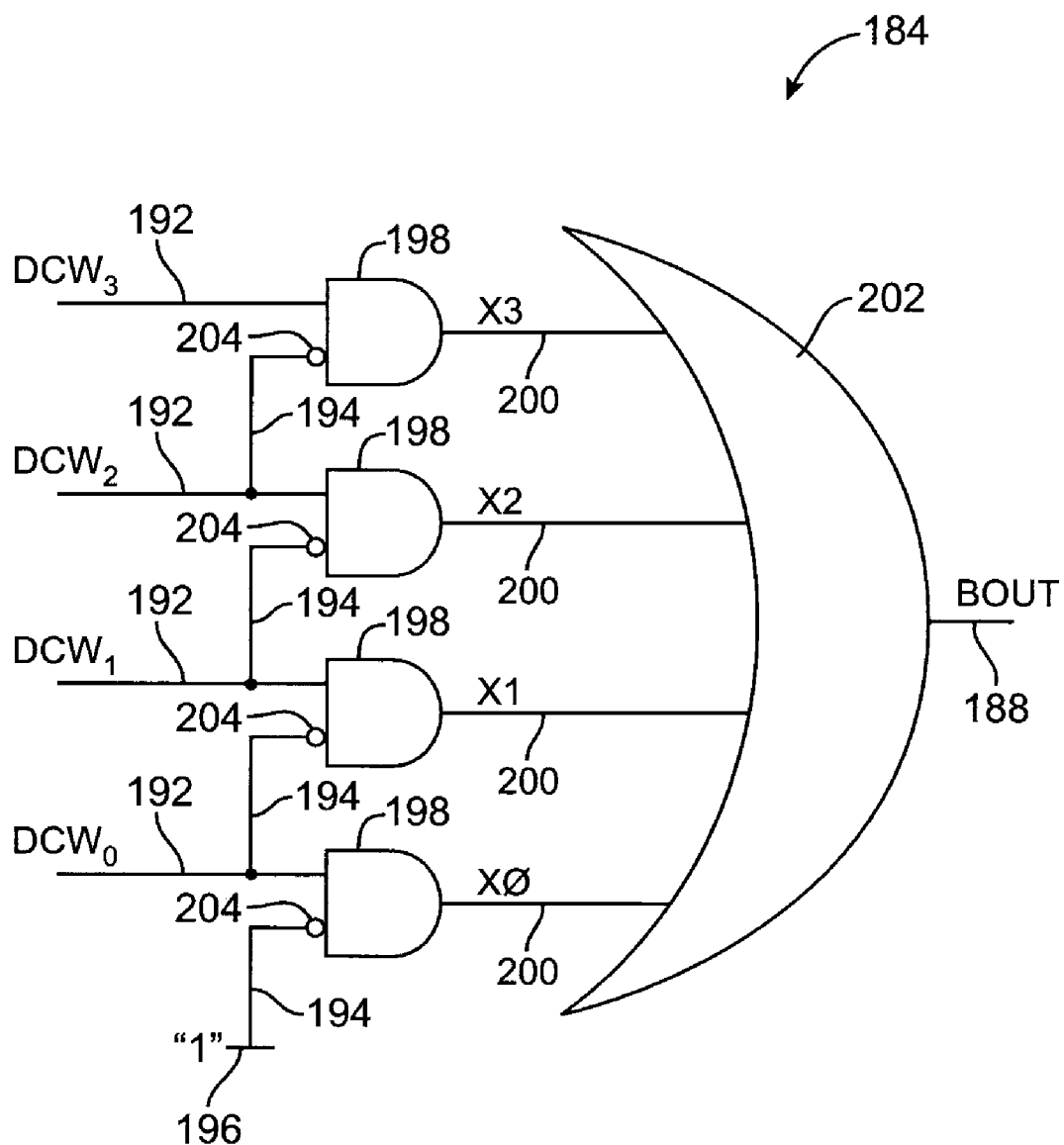
FIG. 11 is an illustrative bubble detection circuit that may be used in a thermometer-code-to-binary encoder such as the illustrative thermometer-code-to-binary encoder of FIG. 10 in accordance with an embodiment of the present invention.

Any suitable bubble detection logic may be used for circuitry 184. An illustrative embodiment of a bubble detection circuit 184 is shown in FIG. 11. In the example of FIG. 11, the thermometer code input signal DCW has four bits (DCW3, DCW2, DCW1, and DCW0). Conductive paths 192 may be used to provide the thermometer code data bits to respective inputs of AND gates 198. Each AND gate 198 may have an inverting input 204 that is connected in a shifted pattern to the DCW inputs via conductive paths 194. The inverting input 204 of the AND gate 198 that is associated with signal DCW0 receives a logic one ("1") bit from terminal 196.

The AND gates 198 produce output signals on output lines 200. Whenever one of the thermometer code bits is a "1" and the preceding thermometer code bit is a "0," it can be concluded that the thermometer code word DCW contains a bubble. In this situation, a corresponding output signal on one of lines 200 will go high. For example, if DCW is 1011 (i.e., if there is a bubble associated with DCW2), the uppermost AND gate of FIG. 11 will generate a high output signal X3. The OR gate 202 performs a logical OR function on the signals on lines 200. If any of these signals is high (i.e., if a bubble has been detected anywhere in DCW), the output BOUT of OR gate 202 on line 188 will be taken high.

A table illustrating the behavior of bubble detection circuit 184 of FIG. 11 is shown in FIG. 12. Each row of the table of FIG. 12 corresponds to a different thermometer code data word.

In the first row of the table of FIG. 12, the word DCW is 0111. In this situation, there is no bubble present in the thermometer code data, so the outputs X3, X2, X1, and X0 of AND gates 198 are all low. With the signals on lines 200 all low, the output BOUT of OR gate 202 will be low, as indicated in the last column in the first row of FIG. 12.

In the second row of the table of FIG. 12, the thermometer code data word DCW is 0011. As with the thermometer code data word associated with the first row, there is no bubble present in the thermometer code data of the second row, so the outputs X3, X2, X1, and X0 of AND gates 198 are again all low. With the signals on lines 200 all low, the output BOUT of OR gate 202 will be low, as indicated in the last column in the second row.

In the third row of the table of FIG. 12, the thermometer code data word DCW is 0101. In this scenario, there is a bubble in the DCW1 bit position. As a result, signal X2 at the output of the DCW2 AND gate (FIG. 11) will be high. This is because both DCW2 and the inverted version of DCW1 at the inputs to this AND gate are high. The high X2 signal causes the output of OR gate 202 to go high, so signal BOUT on output line 188 of bubble detection circuit 184 will be high, as indicated in the last column of the third row of FIG. 12.

Figure 13:
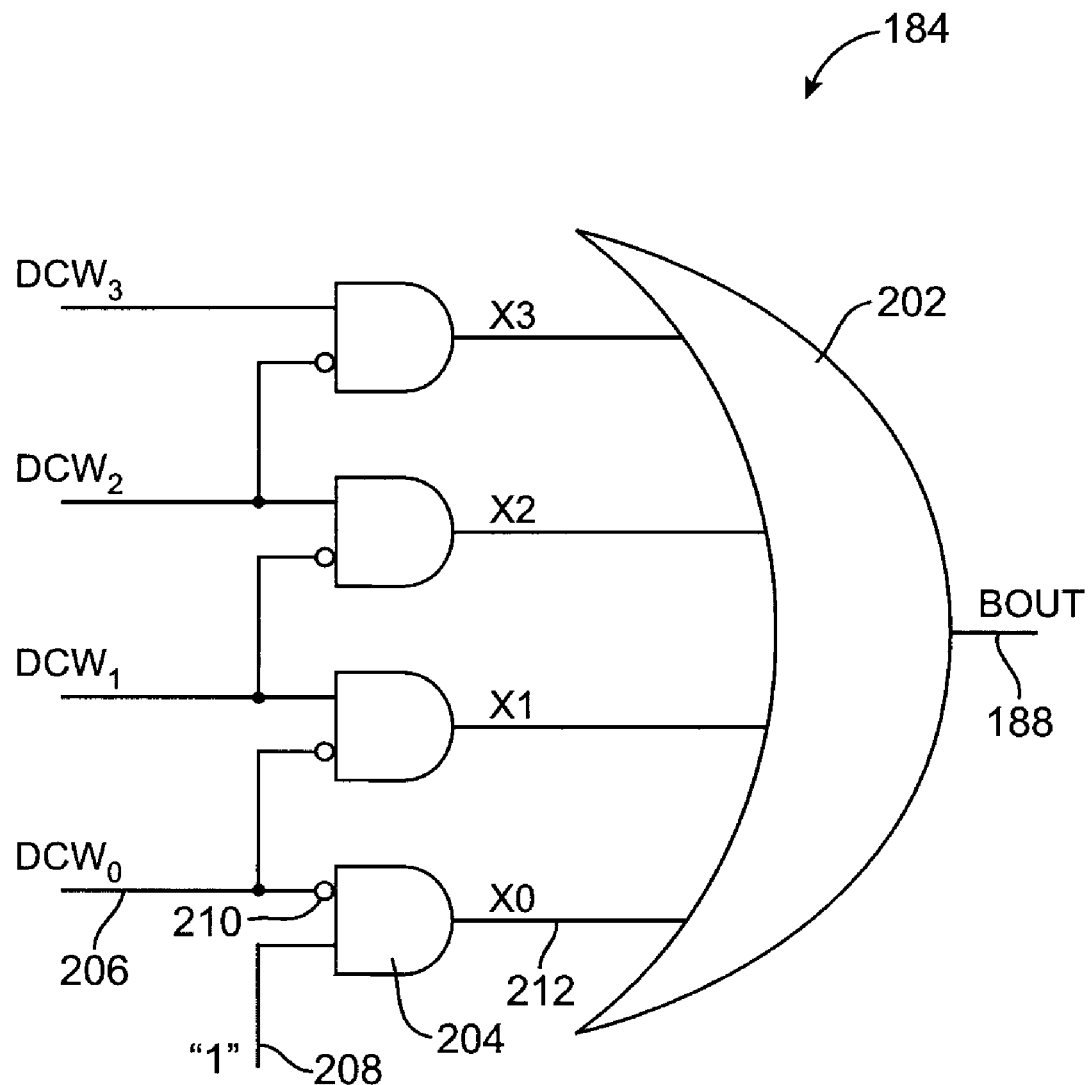
FIG. 13 is an illustrative bubble detection circuit that may be used in a thermometer-code-to-binary encoder such as the illustrative thermometer-code-to-binary encoder of FIG. 10 and that may be used to detect the presence of a bubble in the first digit of a thermometer code data word in accordance with an embodiment of the present invention.

If desired, bubble detection circuit 184 may detect the presence of bubbles in the first bit position of thermometer code data word DCW. Circuitry of this type is shown in FIG. 13. As shown in FIG. 13, bubble detection circuitry 184 may have AND gates that each have an inverting and a noninverting input, as with the arrangement of FIG. 11. This circuitry will detect the presence of a "10" bubble pattern as with the FIG. 11 circuit. In addition, bubble detection circuitry 184 may have an AND gate 204 with an inverting input 210 that receives signal DCW0 from input line 206 and a noninverting input that receives a "1" signal from terminal 208. The AND gate 204 can detect the presence of a bubble in the DCW0 bit. In particular, if DCW0 is 0, the output X0 of AND gate 204 on line 212 will be high. This will cause the output of OR gate 202 on line 188 (signal BOUT) to go high, as shown in the table of FIG. 14.

A thermometer-code-to-binary encoder that handles thermometer code with bubbles such as encoder 68 (FIG. 3) may be used as part of an on-chip digital signal processing circuit. For example, a thermometer-code-to-binary encoder may be used to create binary data that is processed in real time using digital techniques. Digital processing of data may be more accurate to implement in certain contexts than analog processing techniques.

Figure 15:
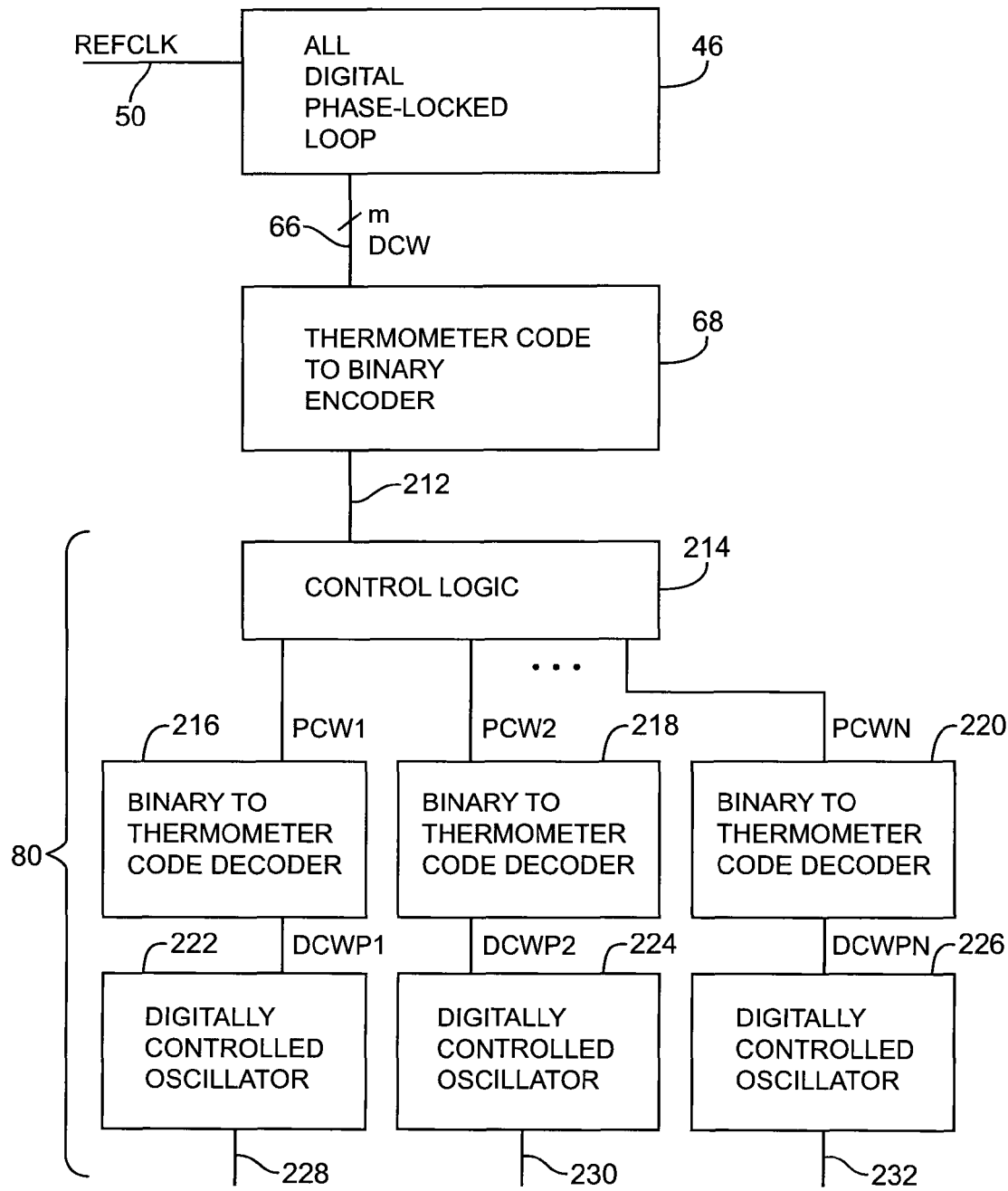
FIG. 15 is a circuit diagram showing how a thermometer-code-to-binary encoder may be used in implementing digital circuit functions based on a thermometer code digital control word generated by a digital phase-locked loop in a digital integrated in accordance with an embodiment of the present invention.

An illustrative circuit arrangement in which encoder 68 is used to provide binary data to processing circuitry such as processing circuitry 80 of FIG. 3 is shown in FIG. 15. In the example of FIG. 15, a reference clock signal REFCLK is provided to all-digital phase-locked loop 46. Digital phase-locked loop 46 of FIG. 15 may, for example, be a digital phase-locked loop circuit of the type described in connection with FIG. 3. Digital phase-locked loop 46 may produce a thermometer code data word on path 66. There may be, for example, m signal lines in path 66 (e.g., tens or hundreds of signal lines). If desired, other digital circuitry may be used to provide a thermometer code data word. The illustrative arrangement of FIG. 15 in which the thermometer code data word DCW on path 66 is provided in the form of data generated by a digital phase-locked loop is merely presented as an example.

As shown in FIG. 15, thermometer code data word DCW may be provided to thermometer-code-to-binary encoder 68 over path 66. Encoder 68 may convert the thermometer code data (with bubbles) at its input to corresponding binary at output 212. The binary signal at output 212 may be provided to control logic 214. Control logic 214 may include any suitable digital processing circuitry. For example, control logic 214 may include circuitry to perform operations on binary data such as multiplication and addition (as examples).

Consider, as an example, a scenario in which it is desired to derive a number of signals, each of which is related to clock REFCLK. In this type of situation, control logic 214 may contain binary processing circuitry that converts the binary representation of REFCLK into a processed binary version of REFCLK. Different processes may be performed on the binary signal by different portions of control logic 214. For example, a first portion of control logic 214 may be used to produce a first processed binary version of DCW (called PCW1), a second portion of control logic 214 may be used to produce a second processed binary version of DCW (called PCW2), and additional portions of control logic 214 may produce additional processed signals (see, e.g., signal PCWN).

The processed binary signals that are produced by control logic 214 may be routed to binary-to-thermometer-code decoders 216, 218, and 220. Decoder 216 may convert processed binary signal PCW1 into a thermometer code digital control word DCWP1, decoder 218 may convert processed binary signal PCW2 into thermometer code digital control word DCWP2, and decoder 220 may convert processed binary signal PCWN into thermometer code digital control word DCWPN. Thermometer code signals DCWP1, DCWP2, and DCWPN may be provided to digitally controlled oscillators 222, 224, and 226, respectively. Each digitally controlled oscillator may produce a corresponding output signal such as a clock signal at a respective one of outputs 228, 230, and 232.

The foregoing is merely illustrative of the principles of this invention and various modifications can be made by those skilled in the art without departing from the scope and spirit of the invention.

What is claimed is:

1. A thermometer-code-to-binary encoder, comprising:
   a plurality of input lines that receive a thermometer code data word;
   a plurality of half adders, each half adder having a pair of inputs that are connected to the input lines and having a pair of outputs at which corresponding half adder output signals are provided; and
   at least one two bit adder that receives the half adder output signals and that produces three corresponding two bit adder output signals.

2. The thermometer-code-to-binary encoder defined in claim 1 wherein the two bit adder comprises a two bit carry look-ahead adder.

3. The thermometer-code-to-binary encoder defined in claim 1 further comprising at least one pipeline stage.

4. The thermometer-code-to-binary encoder defined in claim 1 further comprising a pipeline stage, wherein the pipeline stage has a plurality of registers and wherein each of the registers receives one of the two bit adder output signals.

5. The thermometer-code-to-binary encoder defined in claim 1 further comprising a plurality of three bit adders.

6. The thermometer-code-to-binary encoder defined in claim 5 further comprising at least one four bit adder.

7. The thermometer-code-to-binary encoder defined in claim 6 further comprising at least one five bit adder.

8. The thermometer-code-to-binary encoder defined in claim 7 further comprising at least one six bit adder.

9. The thermometer-code-to-binary encoder defined in claim 8 further comprising a first pipeline stage interposed between the two bit adders and the three bit adders.

10. The thermometer-code-to-binary encoder defined in claim 9 further comprising a second pipeline stage interposed between the four bit adder and the five bit adder.

11. The thermometer-code-to-binary encoder defined in claim 10 further comprising:
    a third pipeline stage interposed between the five bit adder and the six bit adder; and
    a path that connects the input lines to a digital phase-locked loop on a programmable logic device integrated circuit in which the thermometer-code-to-binary encoder is contained.

12. The thermometer-code-to-binary encoder defined in claim 11 further comprising a bubble detection circuit connected to the input lines.

13. The thermometer-code-to-binary encoder defined in claim 1 further comprising a bubble detection circuit connected to the input lines that identifies when the thermometer code data word contains at least one bubble.

14. A method for encoding a thermometer code data word into an output in binary format, comprising:
    obtaining the thermometer code data word, wherein the thermometer code data word includes a plurality of thermometer code bits;
    with a plurality of half adders, adding respective pairs of the thermometer code bits to produce temporary sums, wherein each half adder has two half adder output lines; and
    performing addition on the temporary sums with two bit adders, each of which has four inputs connected to the half adder output lines.

15. The method defined in claim 14 further comprising:
    with a bubble detection circuit, detecting whether the thermometer code data word contains bubbles and generating an output signal in response.

16. The method defined in claim 14 further comprising performing addition with adders other than the half adders and the two bit adders to produce the binary output.

17. The method defined in claim 16 further comprising:
    receiving signals from at least some of the adders using registers in a pipeline stage.

18. The method defined in claim 14 wherein performing addition with the two bit adders comprises performing addition with two bit carry look-ahead adders.

19. Circuitry on an integrated circuit comprising:
    a digital circuit that produces a thermometer code data word that contains at least one bubble;
    a thermometer-code-to-binary encoder that receives and converts the thermometer code data word that contains the bubble to a binary format output, wherein the digital circuit comprises a digital phase-locked loop;
    control logic that processes the binary format output to produce a plurality of processed binary control signals; and
    a plurality of binary-to-thermometer-code decoders each of which receives a respective one of the processed binary control signals.

20. Circuitry on an integrated circuit comprising:
    a digital circuit that produces a thermometer code data word that contains at least one bubble;
    a thermometer-code-to-binary encoder that receives and converts the thermometer code data word that contains the bubble to a binary format output;
    control logic that processes the binary format output to produce a plurality of processed binary control signals; and
    a plurality of circuits each of which receives a respective one of the processed binary control signals.

* * * * *